United States Patent [19]

Horikawa

[11] Patent Number: 4,817,098
[45] Date of Patent: Mar. 28, 1989

[54] SEMICONDUCTOR LASER DRIVER SYSTEM

[75] Inventor: Kazuo Horikawa, Kanagawa, Japan

[73] Assignee: Fuji Photo Film Co., Ltd., Kanagawa, Japan

[21] Appl. No.: 862,875

[22] Filed: May 13, 1986

[30] Foreign Application Priority Data

May 17, 1985 [JP] Japan .................... 60-105577
May 17, 1985 [JP] Japan .................... 60-105578

[51] Int. Cl.$^4$ .............................. H01S 3/13
[52] U.S. Cl. .............................. 372/29; 372/31; 372/33
[58] Field of Search ............... 372/29, 31, 33, 34, 372/43, 24, 38

[56] References Cited

U.S. PATENT DOCUMENTS 4,450,565 5/1984 Copeland ................ 372/38
4,618,958 10/1986 Shibata et al. ........... 372/29
4,630,273 12/1986 Inoue et al. .............. 372/33

FOREIGN PATENT DOCUMENTS 0199446 11/1983 Japan ...................... 372/29

Primary Examiner—William L. Sikes
Assistant Examiner—B. Randolph
Attorney, Agent, or Firm—Sughrue, Mion, Zinn, Macpeak & Seas

[57] ABSTRACT

Light quantity and temperature settings are applied by a control circuit to a semiconductor laser controller and a temperature controller, respectively. A temperature actuator is controlled by the temperature controller responsive to an output signal from a temperature sensor for equalizing the temperature of a semiconductor laser to the temperature setting. The semiconductor laser is controlled by the semiconductor laser controller responsive to an output signal from a light quantity sensor so that a laser beam will be emitted from the semiconductor laser at the light quantity setting. Mode hoping noise is detected by a mode hopping noise detector or the control circuit in combination with a memory which stores mode hopping noise ranges. In response to a mode hopping noise signal, the control circuit changes at least one of the light quantity and temperature settings.

17 Claims, 4 Drawing Sheets

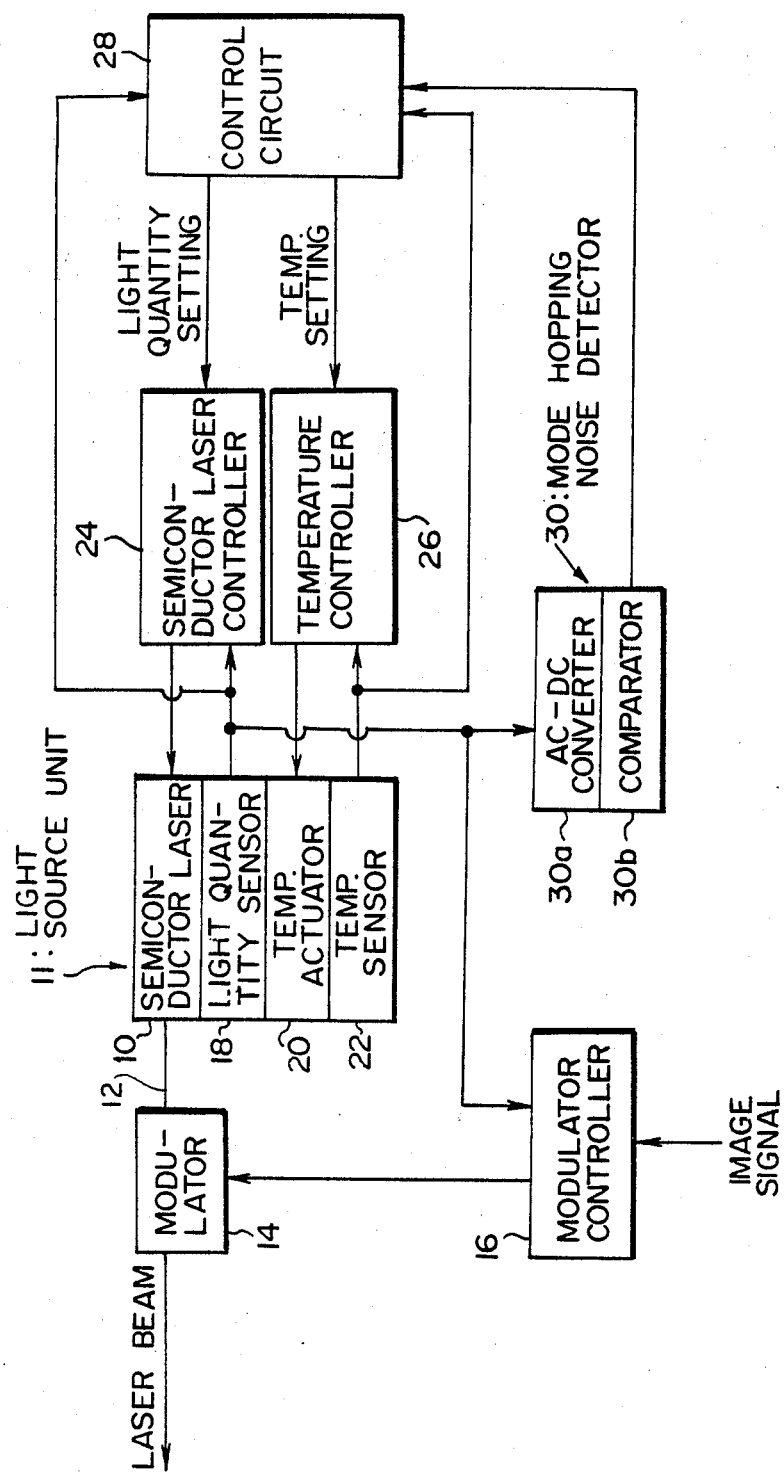

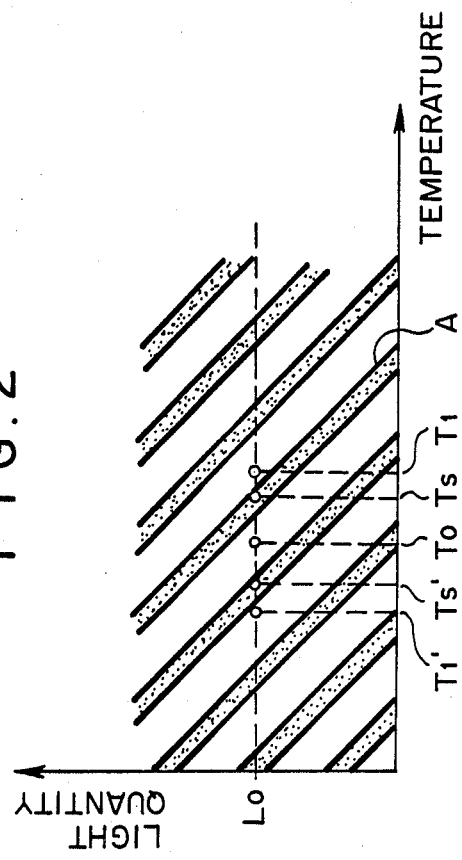
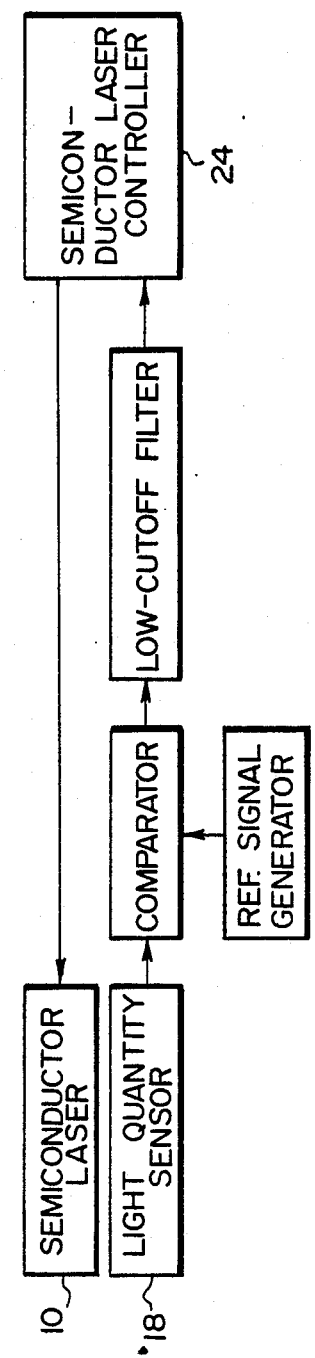

SEMICONDUCTOR LASER DRIVER SYSTEM

BACKGROUND OF THE INVENTION

1. Field of the Invention

The present invention relates to a system for driving a semiconductor laser, and more particuarly to a semiconductor laser driver system capable of preventing mode hopping noise of a semiconductor laser driven thereby.

2. Description of the Prior Art

There are known optical scanning devices for scanning a recording medium with a light beam to record various information such as image information on the recording medium and to read out various information recorded on the recording medium. The light beam used in those optical scanning devices is typically a laser beam emitted from a semiconductor laser.

Where an image having a continuous gradation is to be recorded or read out by scanning the same with a laser beam, the quantity of the emitted laser beam is not allowed to fluctuate by more than a maximum level of about 0.2%.

Semiconductor lasers are susceptible to mode hopping noise under certain conditions in which they are driven. More specifically, the semiconductor laser produces light emission in different modes (wavelengths) under certain conditions. The laser output beam emitted from the semiconductor laser mode hops, i.e., it is shifted from one mode to another and back. Repeated mode hopping causes the quantity of the laser beam to fluctuate, generating mode hopping noise. The quantity of fluctuation of the emitted laser beam due to the mode hopping noise sometimes reaches a few % of the overall laser output power. Therefore, if a laser beam for recording or reading out continuously gradational image formation should suffer from mode hopping noise which causes a few % of laser beam fluctuation, then the recorded or read-out image information would contain irregularities in its gradations.

Consequently, semiconductor lasers used for scanning recording mediums for recording and reading out image information or the like are required to be driven in a manner to avoid the generation of mode hopping noise. However, conventional semiconductor laser drivers are not designed to sufficiently suppress mode hopping noise.

SUMMARY OF THE INVENTION

Therefore, it is an object of the present invention to provide a semiconductor laser driver system capable of preventing mode hopping noise from being generated.

According to the present invention, there is provided a system for driving a semiconductor laser, comprising a light quantity sensor for detecting the light quantity of a laser beam emitted from the semiconductor laser, a temperature sensor for detecting the temperature of the semiconductor laser, a temperature actuator for controlling the temperature of the semiconductor laser, a semiconductor laser controller responsive to an output signal from the light quantity sensor for driving the semiconductor laser so that the light quantity of the laser beam will be equal to a light quantity setting, a temperature controller responsive to an output signal from the temperature sensor for controlling the temperature actuator so that the temperature of the semiconductor laser will be equal to a temperature setting, a mode hopping noise detector response to the output signal from the light quantity sensor for detecting mode hopping noise of the semiconductor laser, and a control circuit for applying the light quantity setting and the temperature setting to the semiconductor laser controller and the temperature controller, respectively, for changing at least one of the light quantity setting and the temperature setting based on a mode hopping noise signal from the mode hopping noise detector.

According to the present invention, there is also provided a system for driving a semiconductor laser, comprising a light quantity sensor for detecting the light quantity of a laser beam emitted from the semiconductor laser, a temperature sensor for detecting the temperature of the semiconductor laser, a temperature actuator for controlling the temperature of the semiconductor laser, a semiconductor laser controller responsive to an output signal from the light quantity sensor for driving the semiconductor laser so that the light quantity of the laser beam will be equal to a light quantity setting, a temperature controller responsive to an output signal from the temperature sensor for controlling the temperature actuator so that the temperature of the semiconductor laser will be equal to a temperature setting, a memory for storing mode hopping noise ranges determined by combinations of the light quantity of the laser beam and the temperature of the semiconductor laser, and a control circuit for applying the light quantity setting and the temperature setting to the semiconductor laser controller and the temperature controller, respectively, and for changing the temperature setting so that the actual combination of the light quantity of the laser beam and the temperature of the semiconductor laser will stay out of the mode hopping noise ranges supplied from the memory.

Mode hopping noise is detected by the mode hopping noise detector or the control circuit in combination with the memory. When mode hopping noise is generated due for example to a change in the ambient temperature or the laser beam light quantity or both, the light quantity setting or the temperature setting or both are changed by the control circuit to drive the semiconductor laser out of the mode hopping noise ranges. Therefore, mode hopping noise can automatically be avoided.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 1 is a block diagram of a semiconductor laser driver system according to an embodiment of the present invention;

FIG. 2 is a graph showing ranges in which mode hopping noise is generated by a semiconductor laser;

FIG. 5 is a block diagram of an arrangement by which an output signal from a light quantity sensor is applied to a semiconductor laser controller.

DESCRIPTION OF THE PREFERRED EMBODIMENTS

Figure 3:
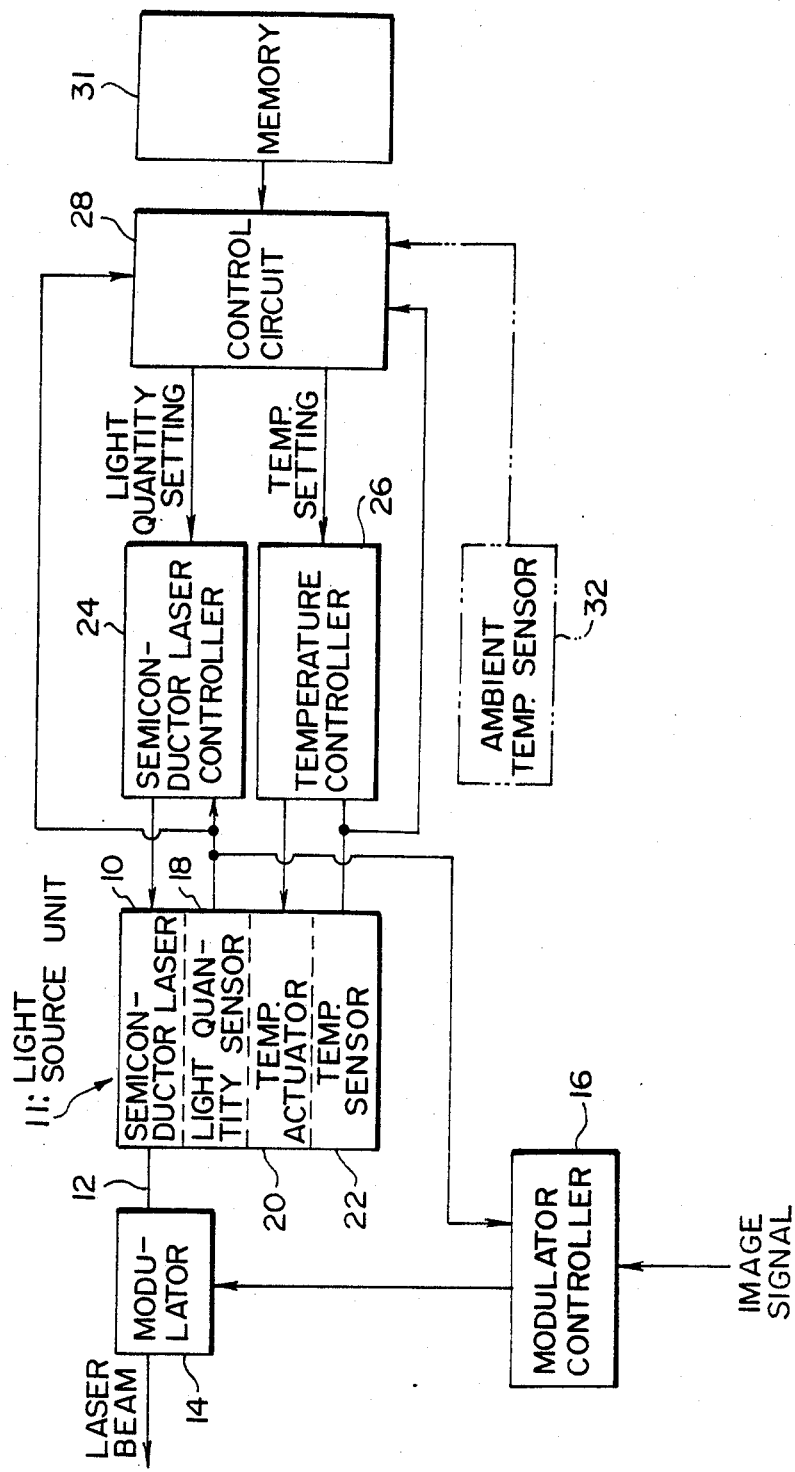
FIG. 3 is a block diagram of a semiconductor laser driver system according to another embodiment of the present invention.

Like or corresponding parts are denoted by like or corresponding reference characters throughout the several views.

FIG. 1 shows a system for driving a semiconductor laser 10, the system being associated with a modulator 14 for modulating a laser beam 12 emitted from the semiconductor laser 10 to record an image signal on a recording medium (not shown) and a modulator controller 16 for controlling the modulator 16 based on the image signal applied thereto.

The system includes a light quantity sensor 18, a temperature actuator 20, and a temperature sensor 22 which cooperate with the semiconductor laser 10 in constituting a light source unit 11.

The light quantity sensor 18 may be any of various light detectors for photoelectrically detecting the quantity of the laser beam 12 emitted from the semiconductor laser 10.

The temperature actuator 20 serves to control the temperature of the semiconductor laser 10. The temperature actuator 20 may be any of various temperature regulators capable of varying the temperature of the semiconductor laser 10, such as a heater for raising the temperature of the semiconductor laser 10, a cooling device for lowering the temperature of the semiconductor laser 10, or a combination heater and cooling device.

The temperature sensor 22 may be any of various temperature detecting devices such as a thermistor for detecting the temperature of the semiconductor laser 10.

The temperature actuator 20 and the temperature sensor 22 are not limit4ed to those which directly control and detect the temperature of the semiconductor device of the semiconductor laser 10, but may be ones which can control and detect the temperature of the semiconductor laser device through a casing in which it is accommodated.

The semiconductor laser 10 is driven by a semiconductor laser controller 24, and the temperature actuator 20 is driven by a temperature controller 26.

An output signal from the light quantity sensor 18 is applied to the semiconductor laser controller 24, which is also supplied with a signal representing a light quantity setting from a control circuit 28. The semiconductor laser controller 24 monitors the light quantity of the laser beam 12 as detected by the light quantity sensor 18, and drives the semiconductor laser 10 with a driving current such that the light quantity of the emitted laser beam will be in conformity with the light quantity setting preset by the control circuit 28.

The temperature controller 26 is supplied with an output signal from the temperature sensor 22 and also with a signal indicative of a temperature setting from the control circuit 28. The temperature controller 26 monitors the temperature of the semiconductor laser 10 as detected by the temperature sensor 22, and operates the temperature actuator 20 so that the temperature of the semiconductor laser 10 will be in conformity with the temperature setting preset by the control circuit 28. The temperature of the semiconductor laser 10 can be controlled into full conformity with the temperature setting only by a temperature actuator having a bidirectional temperature regulating ability to both raise and lower the temperature of the semiconductor laser 10. Where a temperature actuator such as a heater which can only raise the temperature of the semiconductor laser 10 is employed, the temperature of the semiconductor laser 10 cannot be controlled thereby into conformity with the temperature setting when the ambient temperature is higher than the temperature setting. Where a temperature actuator such as a cooling device which can only lower the temperature of the semiconductor laser 10 is employed, the temperature of the semiconductor laser 10 cannot be controlled thereby into conformity with the temperature setting when the ambient temperature is lower than the temperature setting. Furthermore, even where a bidirectional temperature actuator is used, the temperature of the semiconductor laser 10 cannot be controlled thereby into conformity with the temperature setting when the ambient temperature is much higher than the temperature setting, if the ability of the temperature actuator to lower the temperature of the semiconductor laser 10 is extremely low.

The output signal from the light quantity sensor 18 is applied to a mode hopping noise detector 30 which detects mode hopping noise based on the light quantity of the laser beam 12 as detected by the light quantity sensor 18. More specifically, the mode hopping noise detector 30 detects an AC component (fluctuation) of the light quantity of the laser beam 12 and generates a mode hopping noise signal when the detected AC component becomes higher than a predetermined reference or threshold level. The mode hopping noise detector 30 may comprise an AC-DC converter 30a and a comparator 30b for comparing the output signal from the AC-DC converter 30a with the threshold level. The AC-DC converter 30a may comprise an AC voltmeter.

An output signal from the mode hopping noise detector 30 is applied to the control circuit 28. In response to the output signal from the mode hopping noise detector 30, the control circuit 28 changes at least one of the light quantity setting and the temperature setting for avoiding the generation of mode hopping noise.

Mode hopping noise of the semiconductor laser 10 is generated in certain particular ranges determined by combinations of certain laser beam light quantities and certain semiconductor laser temperatures, the particular ranges being indicated as stippled areas in FIG. 2. No mode hopping noise will be generated when the condition (the combination of a laser beam light quantity and a semiconductor laser temperature) in which the semiconductor laser 10 is driven is not in the particular ranges.

In case the temperature actuator 20 is a heater capable of only raising the temperature of the semiconductor laser 10, it is assumed that the semiconductor laser 10 is driven at a light quantity setting Lo and a temperature setting To (FIG. 2). When the amibient temperature Ts becomes higher than the temperature setting To while the semiconductor laser 10 is being thus driven, the temperature of the semiconductor laser 10 is increased up to the ambient temperature Ts. If the ambient temperature Ts should lie in a mode hopping noise range A, then mode hopping noise will be generated by the semiconductor laser 10. To avoid the generation of such mose hopping noise, the temperature of the semiconductor laser 10 is detected by the temperature sensor 22 at all times, and if the temperature of the semiconductor laser 10 is about to be shifted into the mode hopping noise range A as the ambient temperature goes higher, the control circuit 28 changes the temperature setting $T_0$ to a temperature setting $T_1$ higher than and outside of the mode hopping noise range A. Since $T_1 > T_s$, the temperature of the semiconductor laser 10 is kept at $T_1$ by the heater 20, preventing mode hopping noise from being generated. When the ambient temperature Ts continues to rise, the same control as described above is carried out again.

Where the temperature sensor 20 is a cooling device for lowering the temperature of the semiconductor laser 10, and when the ambient temperature Ts' becomes lower than the temperature setting $T_0$ to shift the semiconductor laser temperature into a mode hopping noise range, the control circuit 28 is similarly operated to change the temperature setting $T_0$ to a temperature setting $T_1$, lower than the temperature setting $T_0$.

Where the temperature actuator 20 is a bidircectional temperature regulator capable of both raising and lowering the temperature of the semiconductor laser 10, and when no mode hopping noise is generated by driving the semiconductor laser 10 at initial light quantity and temperature settings, then there is almost no possibility of subsequent generation of mode hopping noise while the semiconductor laser 10 is being driven. However, when mode hopping noise is generated by the semiconductor laser 10 at initial light quantity and temperature settings, it can be avoided by changing the temperature setting in the same manner as described above. When the ambient temperature varies to quite a large extent, the semiconductor laser 10 may produce mode hopping noise if the bidirectional temperature regulating ability of the temperature actuator 20 is insufficient. However, the generation of mode hopping noise can be avoided as well in this case by changing the temperature setting.

Mose hopping noise may be generated not only when the ambient temperature changes but also when the light quantity setting is varied for scanning purpose. Such mode hopping noise can also be prevented from being generated by changing the temperature setting, for example.

In the illustrated embodiment, the semiconductor laser 10 is controlled by changing the light quantity setting and the temperature setting when mode hopping noise is generated.

The laser beam 12 is modulated by the modulator 14 such as an acoustooptic modulator (AOM) based on the image signal applied to the modulator controller 16, and used to record the image signal on the recording medium. Therefore, it is preferable not to induce a variation in the light quantity of the laser beam 12 which is not based on the image signal. It is desirable, if possible, that the generation of mode hopping noise be avoided by varying the temperature of the semiconductor laser 10. However, there is a certain time delay involved before the temperature of the semiconductor laser 10 is actually changed by varying the temperature setting, and mode hopping noise continues to be generated during such a time delay, which is not preferable. On the other hand, the light quantity of the laser beam can be varied by changing the driving current supplied to the semiconductor laser 10. By changing the light quantity setting for the semiconductor laser controller 24, the driving current supplied to the semiconductor laser 10 can immediately be varied by the semiconductor laser controller 24, so that the light quantity of the laser beam can rapidly be changed to avoid the generation of mode hopping noise.

Consequently, when mode hopping noise is produced, it is preferable to change the light quantity setting to vary the driving current, thus varying the light quantity of the emitted laser beam to avoid the generation of mode hopping noise, and simultaneously vary the temperature setting to cause a change in the temperature of the semiconductor laser 10. When the temperature of the semiconductor laser 10 is changed, the light quantity setting is reset to the initial light quantity setting to change the laser driving current back to such a level as to produce the ininial light quantity of the laser beam. As is well known in the art, the liqht quantity of the laser beam emitted by a semiconductor laser depends on the laser driving current and the temperature of the semiconductor laser. Therefore, even when the temperature of the semiconductor laser is changed, the initial laser beam quantity can be obtained by changing the laser driving current to an extent commensurate with the temperature change.

By changing either the light quantity setting only or both the light quantity setting and the temperature setting, the light quantity of the laser beam can be varied, though in different periods of time. Such variation in the light quantity of the laser beam is not preferable since the laser beam carries the image signal and is used to scan the recording medium, and it is desirable to compensate for variations in the light quantity of the laser beam.

To effect such light quantity compensation, the output signal from the light quantity sensor 18 is applied to the modulator controller 16 to correct the image signal with a variation in the light quantity represented by the output signal from the light quantity sensor 18. The modulator controller 16 then drives the modulator 14 with the corrected image signal to modulate the laser beam 12. Where the laser beam 12 is used to read out recorded information from the recording medium, the read-out signal may be corrected by a variation in the light quantity as detected by the light quantity sensor 18.

In varying the light quantiy setting or the temperature setting in the control circuit 28, mode hopping noise can be prevented from being generated by varying the setting in a direction to increase or reduce the light quantity or to raise or lower the temperature, as can be understood from FIG. 2. If the setting were to change only in the direction to increase the light quantity or raise the temperature, for example, the light quantity setting or the temperature setting would become too high after the setting had been changed several times. To avoid this problem, the output signals from the light quantity sensor 18 and the temperature sensor 22 are applied to the control circuit 28, as indicated in FIG. 1, to enable the control circuit 28 to change the light quantity setting and the temperature setting such that they will not be too high or low.

In the above embodiment, mode hopping noise is detected by a digital circuit arrangement. However, mode hopping nose can be detected by an analog circuit arrangement, and the semiconductor laser may be controlled in a manner to suit such an analog circuit arrangement.

FIG. 3 illustrates a semiconductor laser driver system according to another embodiment of the present invention. The semiconductor laser driver system shown in FIG. 3 differs from the system of FIG. 1 in that the mode hopping noise detector 30 (FIG. 1) is dispensed with, and a memory 31 is connected to the control circuit 28. The other components of the semiconductor laser driver system of FIG. 3 are identical to those shown in FIG. 1 and will not be described in detail.

Figure 4:
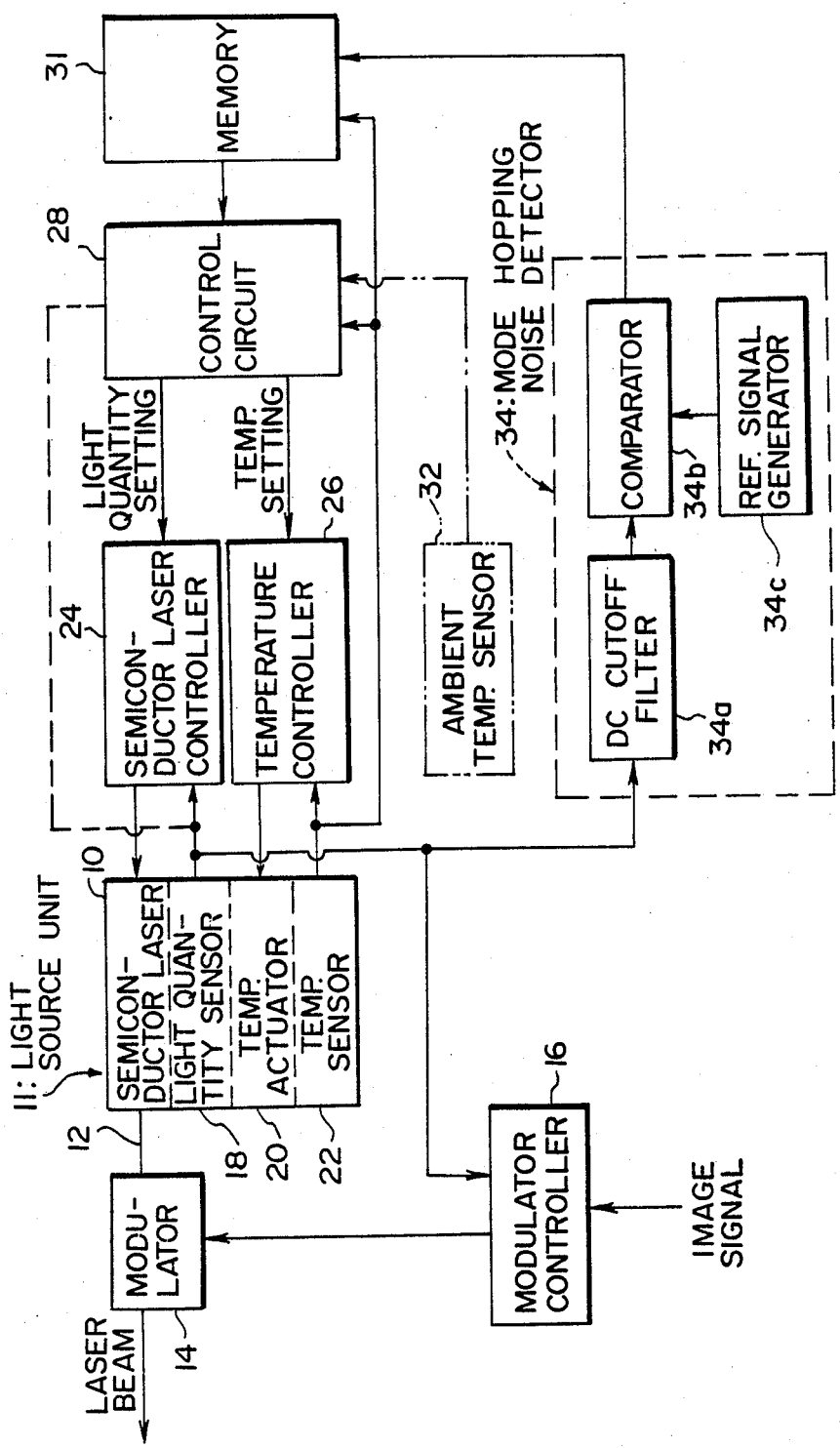
FIG. 4 is a block diagram of a semiconductor laser driver system according to still another embodiment of the present invention.

The memory 31 stores the mode hopping noise ranges shown as stippled areas in FIG. 4 (similar to FIG. 2).

The control circuit 28 compares the temperature of the semiconductor laser 10 as detected by the temperature sensor 22 and the light quantity of the laser beam as detected by the light quantity sensor 18 with the mode hopping noise ranges supplied from the memory 31. If the combination of the temperature and the light quantity tends to be shifted into one of the mode hopping nose ranges, then the control circuit 28 changes the temperature setting applied to the temperature actuator 20 to prevent the temperature/light quantity combination from entering the mode hopping noises for thereby avoiding the generation of mode hopping noise.

The output signal from the light quantity sensor 18 need not necessarily be applied to the control circuit 28 since the output signal of the light quantity sensor 18 is substantially representative of the light quantity setting and the control circuit 28 has information on the light quantity setting.

Instead of applying the output signal from the temperature sensor 22, the output signal from an ambient temperature sensor 32 (FIG. 3) may be applied to the control circuit 28 to enable same to derive the actual temperature at which the semiconductor laser 10 is driven. Where the temperature actuator 20 is a heater, the temperature of the semiconductor laser 10 being driven is equal to the temperature setting if the ambient temperature is lower than the temperature setting, and is equal to the ambient temperature if the ambient temperature is higher than the temperature setting.

It is desirable for the semiconductor laser to be driven at as low a temperature as possible to assure a longer service life and an increase efficiency. However, an expensive cooling device is necessary to keep the semiconductor laser driven at a low temperature far below the ambient temperature, and use of such a cooling device is apt to cause moisture condensation that will adversely affect the laser beam. For these reasons, the temperature of the semiconductor laser should preferably be controlled by a heater so as to be slightly higher than the ambient temperature at all times.

With a heater used as the temperature actuator 20 in the arrangement of FIG. 3, the temperature of the semiconductor laser 10 can be controlled thereby so as to be equal to the temperature T1 which is higher than and closest to the ambient temperature Ts for avoiding the generation of mode hopping noise, while the semiconductor laser 10 is being driven at the given light quantity setting $L_0$. Thus, the semiconductor laser 10 can be driven at as low a temperature as possible, a reduction in the cost of temperature control is achieved, and the problem of moisture condensation is eliminated.

When the temperature setting is changed in a direction to skip the mode hopping noise range A in order to avoid this range, mode hopping noise tends to be generated during a short period of time while the temperature setting is going through the mode hopping range A, thus varying the light quantity of the laser beam. Such a variation of the laser beam quantity can be avoided by correcting the image signal applied to the modulator controller 16 in the same manner as described with reference to FIG. 1.

The mode hopping noise ranges stored in the memory 31 should preferably be of the pattern as shown in FIG. 2, lying over different light quantities of the laser beam, so that different hopping noise ranges can be retrieved for each of the different laser beam light quantities.

FIG. 4 shows a semiconductor laser driver system according to still anothr embodiment of the present invention.

The semiconductor laser driver system of FIG. 4 is substantially the same as that of FIG. 3 except that the output signal from the temperature sensor 22 is supplied to the memory 31 and a mode hopping noise detector 34 is connected to the memory 31 for detecting mode hopping noise ranges and storing them in the memory 31. The mode hopping noise detector 34 is supplied with the output signal from the light quantity sensor 18. The mode hopping noise ranges can be stored in the memory 31 by driving the semiconductor laser 10 at a certain light quantity Lo, operating the temperature actuator 20 to vary the semiconductor laser temperature within a given range, and storing the light quantity Lo and temperatures at which mode hopping noise is produced in the memory 31.

Mode hopping noise is detected when an AC component (fluctuation) of the light quantity of the laser beam 12 exceeds a predetermined reference level. The mode hopping noise detector 34 comprises, for example, a DC cutoff filter 34a, a comparator 34b, and a reference signal generator 34c.

The mode hopping noise ranges stored in the memory 31 may be for a given laser beam light quantity only. If the light quantity of the laser beam is changed, mode hopping noise ranges can then be stored again in the memory 31 for a new laser beam light quantity. This is advantageous since the memory 31 can be updated to meet a change in the mode hopping noise ranges due, for example, to deterioration of the semiconductor laser.

As shown in FIG. 5, the output signal from the light quantity sensor 18 may be compared with a reference signal by a comparator, and an output signal from the comparator may be applied to the semiconductor laser controller 24 via a low-cutoff filter which removes a low-frequency temperature-dependent drift from the laser beam light quantity.

Although certain preferred embodiments have been shown and described, it should be understood that many changes and modifications may be made therein without departing from the scope of the appended claims.

I claim:

1. A system for driving a semiconductor laser, comprising:

light quantity sensor means for detecting the light quantity of a laser beam emitted from said semiconductor laser;

temperature sensor means for detecting the temperature of said semiconductor laser;

temperature actuator means for controlling the temperature of said semiconductor laser;

mode hopping noise detector means responsive to an output signal from said light quantity sensor means, for detecting mode hopping noise of said semiconductor laser;

control circuit means for setting a light quantity reference level and a temperature reference level, and changing at least one of said light quantity reference level and said temperature reference level when an output from said mode hopping noise detector means indicates mode hopping noise;

semiconductor laser controller means responsive to an output signal from said light quantity sensor means and said light quantity reference level, for driving said semiconductor laser so that the light quantity of said laser beam will be equal to said light quantity reference level; and temperature controller means responsive to an output signal from said temperature sensor means and said temperature reference level, for controlling said temperature actuator means so that the temperature of said semiconductor laser will be equal to said temperature reference level;

mode hopping noise detector means responsive to an output signal from said light quantity sensor means, for detecting mode hopping noise of said semiconductor laser; and control circuit means for applying said light quantity setting and said temperature setting to said semiconductor laser controller means and said temperature controller means, respectively, for changing at least one of said light quantity setting and said temperature setting based on a mode hopping noise signal from said mode hopping noise detector means.

2. A system according to claim 1, wherein said temperature actuator means comprises a heater for raising the temperature of said semiconductor laser.

3. A system according to claim 1, wherein said temperature actuator means comprises a cooling device for lowering said temperature of the semiconductor laser.

4. A system according to claim 1, wherein said temperature actuator means comprises a heater/cooling device combination for selectively raising and lowering the temperature of said semiconductor laser.

5. A system according to claim 1, wherein said mode hopping noise detector means comprises an AC-DC converter means being supplied with said output signal from said light quantity sensor means, and comparator means for comparing an output signal from said AC-DC converter means with a reference level.

6. A system according to claim 1, wherein said control circuit means is responsive to said output signals from said light quantity means sensor and said temperature sensor means, for limiting said light quantity setting and said temperature setting.

7. A system according to claim 1, further including modulator means for modulating said laser beam emitted from said semiconductor laser, and a modulator controller means for applying a modulating signal to said modulator means, said modulator controller means being responsive to said output signal from said light quantity sensor means, for correcting said modulating signal.

8. A system according to claim 1, further including comparator means for comparing said output signal from said light quantity sensor means with a reference signal, and a low-cutoff filter means for removing a low-frequency component from an output signal of said comparator means and applying an output signal to said semiconductor laser.

9. A system for driving a semiconductor laser, comprising:
(i) light quantity sensor means for detecting the light quantity of a laser beam emitted from said semiconductor laser;
(ii) temperature sensor means for detecting the temperature of said semiconductor laser;
(iii) temperature actuator means for controlling the temperature of said semiconductor laser;
(iv) semiconductor laser controller means responsive to an output signal from said light quantity sensor means, for driving said semiconductor laser so that the light quantity of said laser beam will be equal to a light quantity setting;
(v) temperature controller means responsive to an output signal from said temperature sensor means, for controlling said temperature actuator means so that the temperature of said semiconductor laser will be equal to a temperature setting;
(vi) memory means for storing mode hopping noise ranges determined by combinations of said light quantity of said laser beam and said temperature of said semiconductor laser; and
(vii) control circuit means for applying said light quantity setting and the temperature setting to said semiconductor laser controller means and said temperature controller means, respectively, and for changing said temperature setting so that the actual combination of said light quantity of said laser beam and said temperature of said semiconductor laser will stay out of said mode hopping noise ranges supplied from said memory means.

10. A system according to claim 9, further including mode hopping noise detector means responsive to said output signal from said light quantity sensor means, for detecting mode hopping noise of said semiconductor laser, the arrangement being such that each of said mode hopping noise ranges can be detected from said mode hopping noise signal from said mode hopping noise detector means and said output signal from said temperature sensor means.

11. A system according to claim 9, wherein said temperature actuator means comprises a heater for raising the temperature of said semiconductor laser.

12. A system according to claim 9, wherein said temperature actuator means comprises a cooling device for lowering the temperature of said semiconductor laser.

13. A system according to claim 9, wherein said temperature actuator means comprises a heater/cooling device combination for selectively raising and lowering the temperature of said semiconductor laser.

14. A system according to claim 9, wherein said mode hopping noise detector means comprises a DC-cutoff filter means for being supplied with said output signal from said light quantity sensor means, and comparator means for comparing an output signal from said DC-cutoff filter means with a reference level.

15. A system according to claim 9, wherein said control circuit means is responsive to said output signals from said light quantity sensor means and said temperature sensor means, for limiting said light quantity setting and said temperature setting.

16. A system according to claim 9, further including modulator means for modulating the laser beam emitted from said semiconductor laser, and a modulator controller means for applying a modulating signal to said modulator means, said modulator controller means being responsive to said output signal from said light quantity sensor means, for correcting said modulating signal.

17. A system according to claim 9, further including comparator means for comparing said output signal from said light quantity sensor means with a reference signal, and low-cutoff filter means for removing a low-frequency component from an output signal of said comparator and applying an output signal to said semiconductor laser.

* * * * *